United States Patent
Shin et al.

(10) Patent No.: US 7,863,640 B2
(45) Date of Patent: Jan. 4, 2011

(54) LIGHT EMITTING DIODE PACKAGE, CIRCUIT BOARD FOR LIGHT EMITTING DIODE PACKAGE AND METHOD OF MANUFACTURING THE SAME

(75) Inventors: Sang Hyun Shin, Gyunggi-Do (KR); Seog Moon Choi, Seoul (KR); Young Ki Lee, Seoul (KR)

(73) Assignees: Samsung Electro-Mechanics Co., Ltd., Gyunggi-do (KR); Samsung LED Co., Ltd., Gyunggi-do (KR)

( * ) Notice: Subject to any disclaimer, the term of this patent is extended or adjusted under 35 U.S.C. 154(b) by 259 days.

(21) Appl. No.: 11/710,436

(22) Filed: Feb. 26, 2007

(65) Prior Publication Data

US 2007/0201213 A1 Aug. 30, 2007

(30) Foreign Application Priority Data

Feb. 27, 2006 (KR) .................... 10-2006-0018861

(51) Int. Cl.
*H01L 23/34* (2006.01)
*H05K 1/14* (2006.01)

(52) U.S. Cl. ............... 257/99; 257/713; 257/E33.056; 257/E33.057; 361/736

(58) Field of Classification Search ............... 257/99, 257/E33.056, 713, E33.057; 361/736
See application file for complete search history.

(56) References Cited

U.S. PATENT DOCUMENTS 5,661,341 A * 8/1997 Neftin ........................ 257/698

2006/0261364 A1 * 11/2006 Suehiro et al. ............. 257/100
2007/0023893 A1 2/2007 Shin et al.

FOREIGN PATENT DOCUMENTS

JP 2007-43155 2/2007
KR 10-2006-0004569 1/2006

OTHER PUBLICATIONS

Korean Office Action, with English Translation, issued in corresponding Korean Patent Application No. 10-2006-0018861, Dated on Apr. 30, 2007.
Japanese Office Action, with English translation, issued in Japanese Patent Application No. 2007-039445, dated Apr. 6, 2010.

* cited by examiner

*Primary Examiner*—Hung Vu
*Assistant Examiner*—Vernon P Webb
(74) *Attorney, Agent, or Firm*—McDermott Will & Emery LLP

(57) ABSTRACT

A circuit board for a light emitting diode package improved in heat radiation efficiency and a manufacturing method thereof. In a simple manufacturing process, insulating layers are formed by anodizing on a portion of a thermally conductive board body and plated with a conductive material. In the light emitting diode package, a board body is made of a thermally conductive metal. Insulating oxidation layers are formed at a pair of opposing edges of the board body. First conductive patterns are formed on the insulating oxidation layers, respectively. Also, second conductive patterns are formed in contact with the board body at a predetermined distance from the first conductive patterns, respectively. The light emitting diode package ensures heat generated from the light emitting diode to radiate faster and more effectively. Additionally, the insulating layers are formed integral with the board body by anodizing, thus enhancing productivity and durance.

12 Claims, 7 Drawing Sheets

LIGHT EMITTING DIODE PACKAGE, CIRCUIT BOARD FOR LIGHT EMITTING DIODE PACKAGE AND METHOD OF MANUFACTURING THE SAME

CLAIM OF PRIORITY

This application claims the benefit of Korean Patent Application No. 2006-18861 filed on Feb. 27, 2005 in the Korean Intellectual Property Office, the disclosure of which is incorporated herein by reference.

BACKGROUND OF THE INVENTION

1. Field of the Invention

The present invention relates to a light emitting diode package, more particularly, in which insulating layers are formed by anodizing on a portion of a thermally conductive board by anodizing and plated with a conductive material, thereby simplifying its manufacturing process and improving heat radiation efficiency, a circuit board for a light emitting diode and a manufacturing method thereof.

2. Description of the Related Art

A backlight for a mobile phone, a navigation system and a personal digital assistant (PDA) mainly adopts a light emitting device using a light emitting diode which is long in useful life and can be reduced in size. The light emitting device using the light emitting diode is more advantageous than a light emitting device using a cold cathode fluorescent lamp (CCFL). That is, the light emitting diode (LED) is environment-friendly, quick to respond to with a rate of several nano seconds, thus assuring higher color reproductivity. Also, the LED is adjustable in its light amount to arbitrarily alter brightness and color temperature.

The light emitting device using the light emitting diode is largely constructed of a circuit board having a current pattern formed thereon, and a light emitting diode disposed on the circuit board. Recently, with a high-output light emitting diode commercially viable, there has arisen a demand for the circuit board capable of radiating heat generated from the light emitting diode more effectively.

A conventional light emitting device using a light emitting diode will be explained with reference to the accompanying drawings.

FIG. 1 is an exploded perspective view illustrating the conventional light emitting device.

As shown in FIG. 1, the light emitting device 1 includes a circuit board 3 with a current pattern formed thereon, a light emitting diode 6 disposed on the circuit board 3 and a reflective member 2 for guiding direction of light from the light emitting diode.

The circuit board 3 is made of an insulating material and a pair of electrodes 4a and 4b are formed at opposing sides to be electrically connected to the outside. Conductive patterns 5a and 5b of e.g., a copper foil are formed on a top surface of the circuit board 3. The conductive patterns 5a and 5b are electrically connected to the electrodes 4a and 4b, respectively and extended toward a center of the top surface of the circuit board body 3. Moreover, fixed electrode patterns 7a to 7d made of e.g., the copper foil, are provided at each corner of the top surface of the circuit board 3. Here, an insulating film 8 may be provided on the electrodes 4a and 4b and the conductive patterns 5a and 5b to insulate the top surfaces thereof.

The reflective member 2 is made of a resin such as a heat-resistant high-performing plastic or a metal such as copper and aluminum. The reflective member 2 has a reflective through hole 2a perforated in a central portion thereof to seat the light emitting diode 6. An inner wall of the reflective through hole 2a is bright-plated with silver or nickel to enhance reflectivity of light emitted from the light emitting diode 6. Here, the reflective member may be bright-plated on all sides thereof.

The reflective member 2 and the circuit board body 3 are sized substantially identical to each other.

The light emitting diode 6 is disposed in a mounting area 3a, i.e., the central portion of the top surface of the circuit board 3. Although not illustrated, an anode and a cathode are electrically connected to the conductive patterns 5a and 5b, respectively.

Accordingly, current applied to the circuit board 3 flows to the light emitting diode 6 through the electrodes 4a and 4b, and the conductive patterns 5a and 5b so that the light emitting diode 6 emits light upward.

Heat generated from the light emitting diode 6 is radiated through the circuit board 3, that is, an insulating member connected to an underside surface of the light emitting diode 6. In general, since the insulating material is very low in thermal conductive efficiency, the conventional light emitting device 1 structured as above cannot radiate heat from the light emitting diode 6 effectively.

In an attempt to overcome the problem, a circuit board has been proposed, in which a through hole is perforated in an area where the light emitting diode 6 is disposed, and filled with a thermal conductive material. Yet this structure complicates a manufacturing process, and limitedly enhances heat radiation efficiency due to contact of the thermal conductive material with only a portion of the underside surface of the light emitting diode.

In addition, in the circuit board body 3 configured as above, the electrodes 4a and 4b, conductive patterns 5a and 5b and the insulating layer 8 should be fabricated separately. This renders the manufacturing process cumbersome, increases manufacturing costs and significantly undermines productivity.

SUMMARY OF THE INVENTION

The present invention has been made to solve the foregoing problems of the prior art and therefore an aspect of the present invention is to provide a circuit board for a light emitting diode package which radiates heat generated from a light emitting diode more effectively, reduces manufacturing costs through a simplified manufacturing process, and boosts productivity, and a manufacturing method thereof.

According to an aspect of the invention, the circuit board for the light emitting diode package having a light emitting diode disposed thereon, including a board body made of a thermally conductive metal; insulating oxidation layers formed at a pair of opposing edges of the board body; first conductive patterns formed on the insulating oxidation layers, respectively; and second conductive patterns formed in contact with the board body at a predetermined distance from the first conductive patterns, respectively.

The board body is made of one selected from a group consisting of aluminum, titanium, tantal, magnesium, hafnium and alloys thereof.

The insulating oxidation layers are formed by anodizing.

The insulating oxidation layers have a uniform thickness.

Alternatively, the insulating oxidation layers are formed on surfaces of the opposing edges of the board body including upper and lower surfaces and flank surfaces thereof.

The insulating oxidation layers have both end portions thereof located in a top surface of the board body extending toward a central line of the board body, which is substantially parallel with the opposing edges.

According to another aspect of the invention, the method for manufacturing a circuit board for a light emitting diode package includes:

perforating at least two through holes in a board body made of a thermally conductive metal;

forming insulating oxidation layers in predetermined surface areas of the board body, which are adjacent to upper and lower ends of the through holes, and inner wall surfaces of the through holes, respectively;

forming first conductive patterns on the insulating oxidation layers and second conductive patterns between the first conductive patterns; and cutting the board body in such a fashion that the first conductive patterns are disposed at opposing edges of the board body and the second conductive patterns are located in a central portion of the board body.

The through holes are formed in at least two rows in the perforating step, and each of the insulating oxidation layers is formed to surround the through holes in each of the rows in the step of forming the insulating oxidation layers.

The insulating oxidation layers are formed by anodizing.

The board body is made of one selected from a group consisting of aluminum, titanium, tantal, magnesium, halfnium and alloys thereof.

According to further another aspect of the invention, the light emitting diode package includes a board body made of a thermally conductive metal; insulating oxidation layers formed at opposing edges of the board body; first conductive patterns formed on the insulating oxidation layers, respectively; second conductive patterns formed in contact with the board body at a predetermined distance from the first conductive patterns, respectively; a light emitting diode disposed on the second conductive patterns and electrically connected to the first conductive patterns; and a transparent resin covering the light emitting diode.

The board body is made of one selected from a group consisting of aluminum, titanium, tantal, magnesium, halfnium and alloys thereof.

The insulating oxidation layers are formed by anodizing.

The insulating oxidation layers have a uniform thickness.

Alternatively, the insulating oxidation layers are formed on surfaces of the opposing edges of the board body including upper and lower surfaces and flank surfaces thereof.

The insulating oxidation layers are formed such that both end portions thereof located in a top surface of the board body are extended toward a central line of the board body, which is substantially parallel with the opposing edges.

According to further another aspect of the invention, the method for manufacturing the light emitting diode package includes:

perforating at least two through holes in a board body made of a thermally conductive metal;

forming insulating oxidation layers in predetermined areas of the board body, which are adjacent to upper and lower ends of the through holes, and inner wall surfaces of the through holes, respectively;

forming first conductive patterns on the insulating oxidation layers, respectively, and second conductive patterns between the first conductive patterns;

disposing light emitting diodes on the second conductive patterns between the through holes, respectively, and electrically connecting the light emitting diodes with the first conductive patterns;

coating a transparent resin to cover the light emitting diodes; and cutting the board body to separate the light emitting diodes into each unit The through holes are formed in at least two rows in the perforating step, each of the insulating oxidation layers is formed to surround the through holes in each of the rows in the step of forming the insulating oxidation layers, and each of the light emitting diodes is disposed between two of the through holes in different rows in the step of disposing the light emitting diodes.

The transparent resin is formed of a strip to entirely cover the rows of the light emitting diodes.

The insulating oxidation layers are formed by anodizing.

The board body is made of one selected from a group consisting of aluminum, titanium, tantal, magnesium, halfnium and alloys thereof.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIGS. 2 to 7 are plan views sequentially illustrating a method for manufacturing a light emitting diode package according to the invention.

Figure 1:
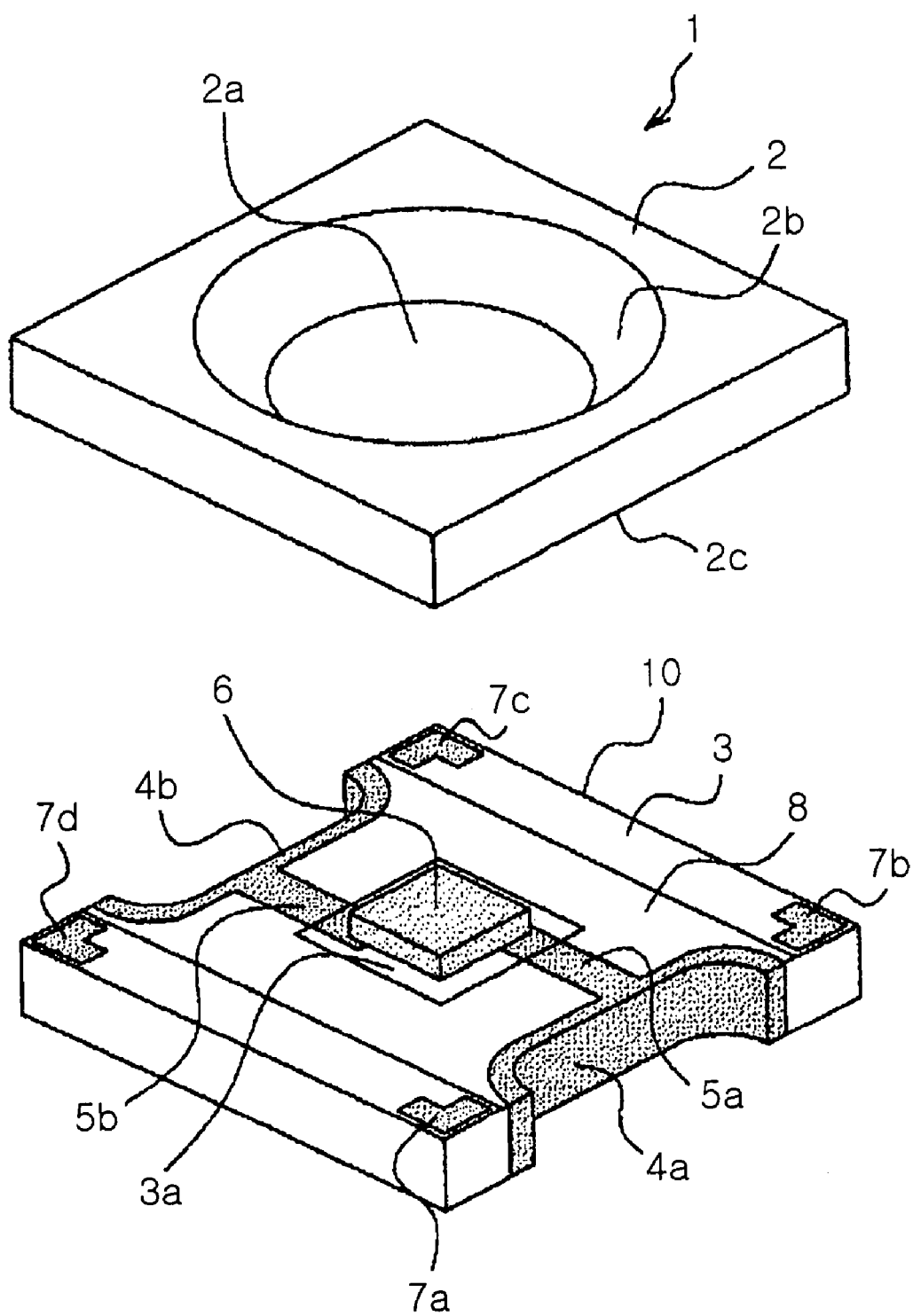
FIG. 1 is an exploded perspective view illustrating a conventional light emitting device.
Figure 2:
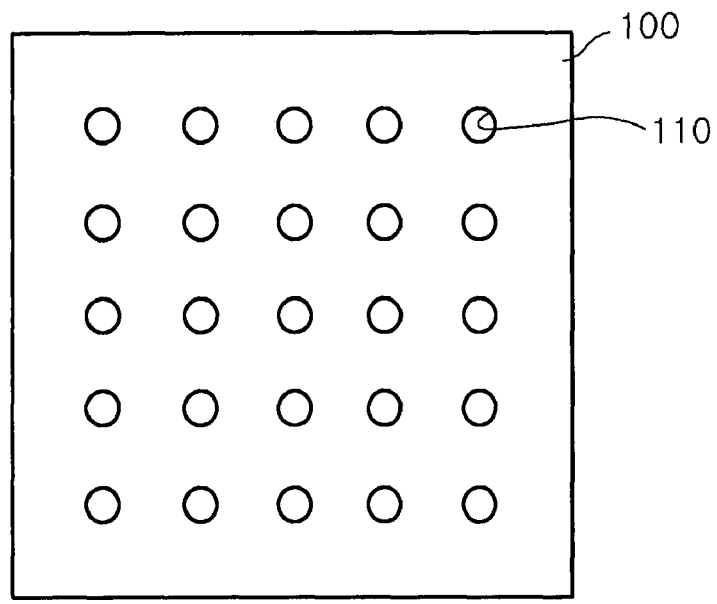
FIGS. 2 to 7 are plan views sequentially illustrating a method for manufacturing a light emitting diode package according to the invention.
Figure 3:
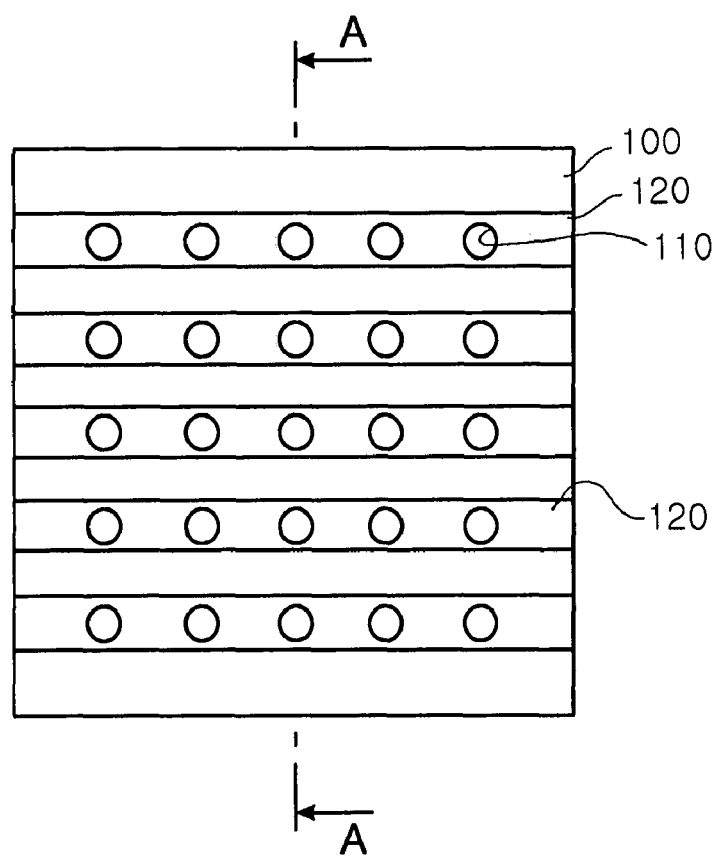

To manufacture a circuit board for a light emitting diode package according to the invention, first, as shown in FIG. 2, through holes 110 are formed in rows in a board body 100 made of a thermally conductive metal. As shown in FIG. 3, insulating oxidation layers 120 are formed to surround the through holes 110 in each of the rows.

Preferably, the insulating oxidation layers 120 are provided, respectively, as a strip extending on the row of the through holes 110. This allows the insulating oxidation layers 120 to surround the through holes 110 in each of the rows through a single process. Preferably, the insulating oxidation layers 120 are formed more easily by anodizing. The anodizing obviates a need for separate manufacturing and bonding of the insulating oxidation layers 120, thereby simplifying a manufacturing process. Also, the anodizing allows the insulating oxidation layers 120 to be formed integral with the board body 100, thereby enhancing durability. The anodizing is generally utilized in forming an oxidation film, which thus will be explained in no more detail.

Moreover, to form the insulating oxidation layers 120 by the anodizing, the board body 100 preferably is made of one selected from a group consisting of aluminum, titanium, tantal, magnesium, halfnium and alloys thereof.

Figure 4:
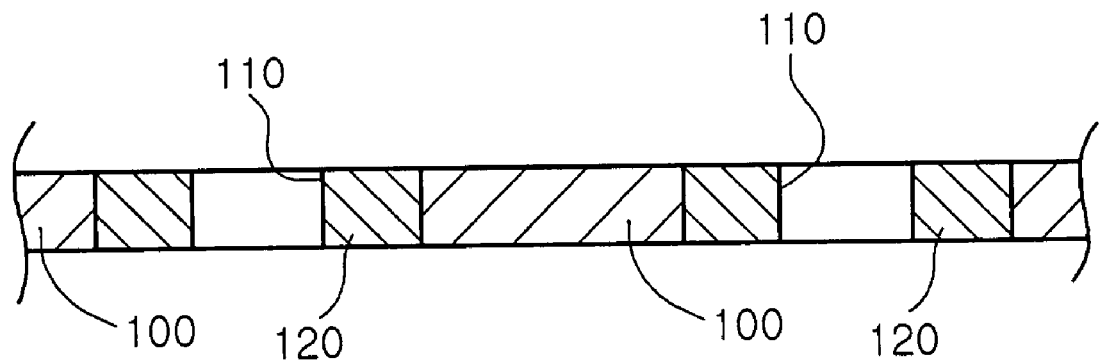

FIG. 4 is a cross-sectional view illustrating the board body 100 cut along the line A-A of FIG. 3. As shown in FIG. 4, the insulating oxidation layers 120 are provided adjacent to upper and lower openings of the through holes 110 and in inner walls thereof, respectively. Here, top surfaces of the insulating oxidation layers 120 define a region where first conductive patterns 210 (not illustrated) will be formed later. Thus, the insulating oxidation layers 120 have a uniform thickness from the inner walls of the through holes 110. The insulating oxidation layers 120 can be varied in thickness thereof.

The insulating oxidation layers 120, as shown in this embodiment, may extend vertically through an entire adjacent area surrounding the through holes 100 so that the insulating oxidation layers 120 have a uniform thickness from the inner walls of the through holes 110. Alternatively, as described above, the insulating oxidation layers 120 may be provided adjacent to upper and lower openings of the through holes 110 and in inner walls thereof. Here, the insulating oxidation layer 120 formed only adjacent to upper and lower openings of the through holes 110 and in inner walls thereof will be explained with reference to a separate drawing.

Figure 5:
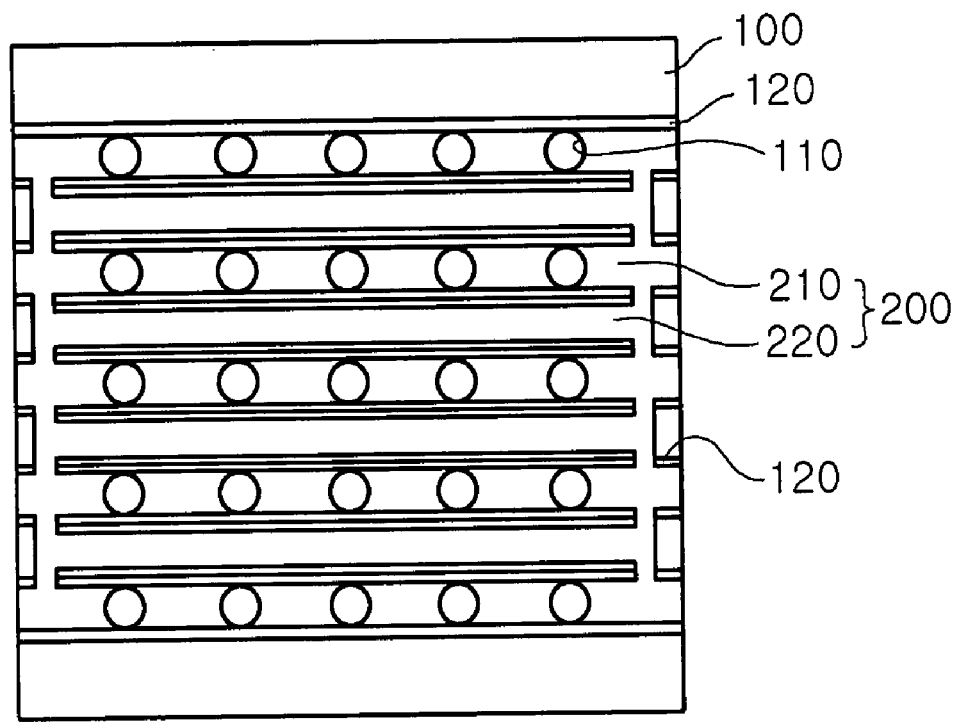
Figure 6:
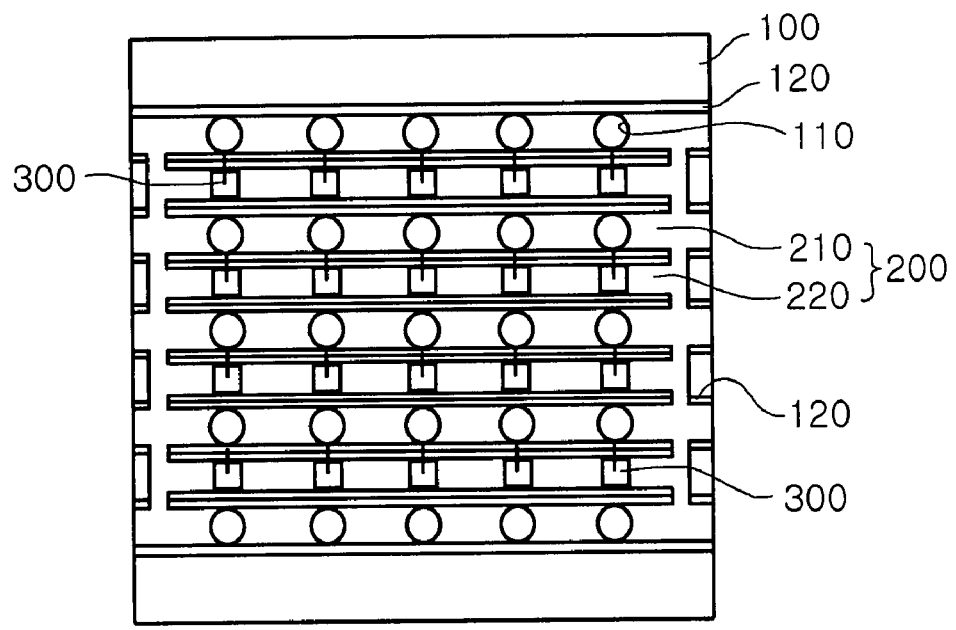

With the insulating oxidation layers 120 formed as described above, first conductive patterns 210 are formed on the insulating oxidation layers 120, respectively and second conductive patterns 220 are formed between the first conductive patterns 210 as shown in FIG. 5. The first patterns 210 will have wires joined thereto to supply current to a light emitting diode 300 (not illustrated) later. Accordingly, to facilitate joining of the wires, preferably, the first patterns 210 are provided on top and underside surfaces of the board body 100. Furthermore, the second conductive patterns 220 define a region where the light emitting diode 300 is disposed later, and thus each preferably has a flat top surface.

The first and second conductive patterns 210 and 220 can be formed by general plating methods or various methods such as metal deposition. Also, other alternative methods can be adopted.

In this embodiment, the first conductive patterns 210 and the second conductive patterns 210 and 220 are connected to each other at both side ends thereof, merely to facilitate formation of the first and second conductive patterns 210 and 220. That is, a connecting portion between the first and second conductive patterns 210 and 220 is cut and removed later so that the first and second conductive patterns 210 and 220 are considered as a separate constitution.

In addition, according to this embodiment, the first and second patterns 210 and 220 are formed of a strip along each of the rows of the through holes 110 for the sake of manufacturing convenience and higher productivity. But the first and second conductive patterns 210 and 220 are not limited thereto in a shape thereof. For example, alternatively, the first conductive patterns 210 may be formed around each of the through holes 110 and the second conductive patterns 220 may be formed to alternate with the respective first conductive patterns 210.

After the first and second conductive patterns 220 are completed as described above, light emitting diodes 300 are disposed on the conductive patterns 220 formed between two of the through holes 110 in different rows. Then the light emitting diodes 300 are electrically connected to the first conductive patterns 210 by wires.

The light emitting diodes are disposed by die bonding or eutectic bonding. In the former method, an adhesive such as silver paste, transparent epoxy and solder is coated on the second conductive patterns 220 and then the light emitting diodes are disposed thereon, respectively to be heat treated at a predetermined temperature. In the latter method, the light emitting diodes 300 are subjected to fluxless or flux eutectic bonding. The light emitting diodes may be disposed by any conventional method for manufacturing the light emitting device.

Figure 7:
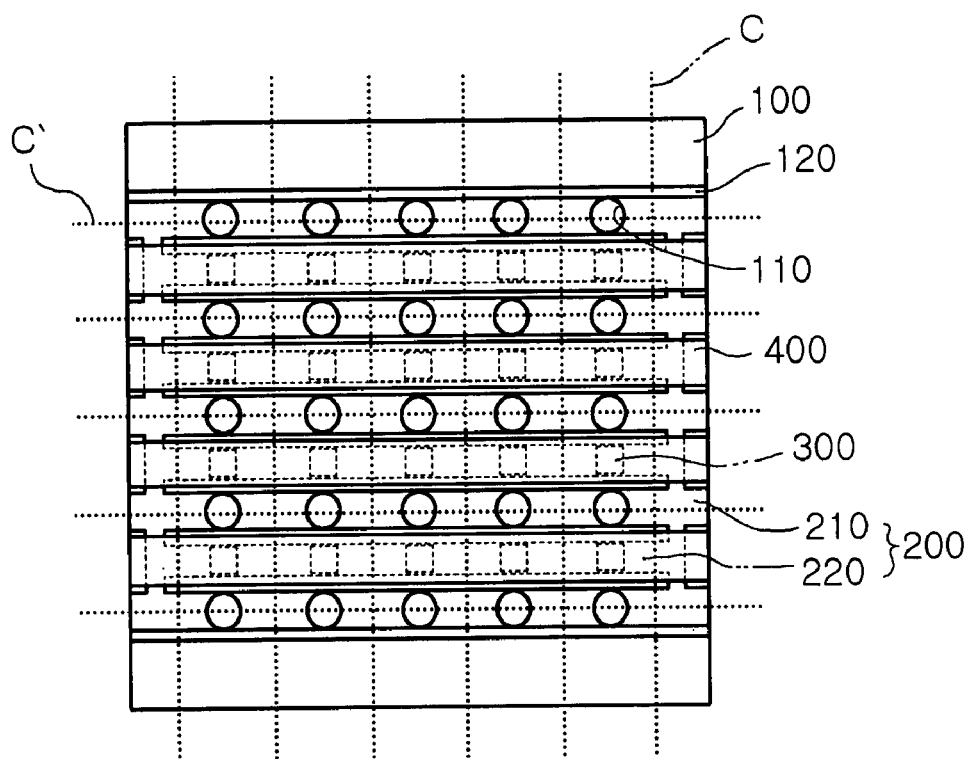

After the light emitting diodes 300 are disposed, as shown in FIG. 7, a transparent resin 400 is coated to cover the light emitting diodes 300. Then, the board body 100 is cut along a trimming line C to separate the light emitting diodes 300 into each unit. Here, the transparent resin 400 is formed as a strip along each of the rows of the through holes 110 in the same manner as the first and second conductive patterns 210 and 220 for the sake of manufacturing convenience and higher productivity. However, the transparent resin 400 may be applied individually around each of the light emitting diodes.

The manufacturing method of the light emitting diode package according to the invention as just described produces a plurality of light emitting diode packages through a single process, thereby improving productivity. Also, insulating layers are formed not separately as in the conventional method, but more easily by anodizing. This simplifies a manufacturing process and saves manufacturing costs.

Here, in order to manufacture only the circuit board for use in the light emitting diode package, the board body 100 is cut along a trimming line C as shown in FIG. 7, with the insulating oxidation layers 120, and the first and second conductive patterns 210 and 220 formed as shown in FIG. 5, thereby producing a plurality of circuit boards for the light emitting diode package through a single process.

Figure 8:
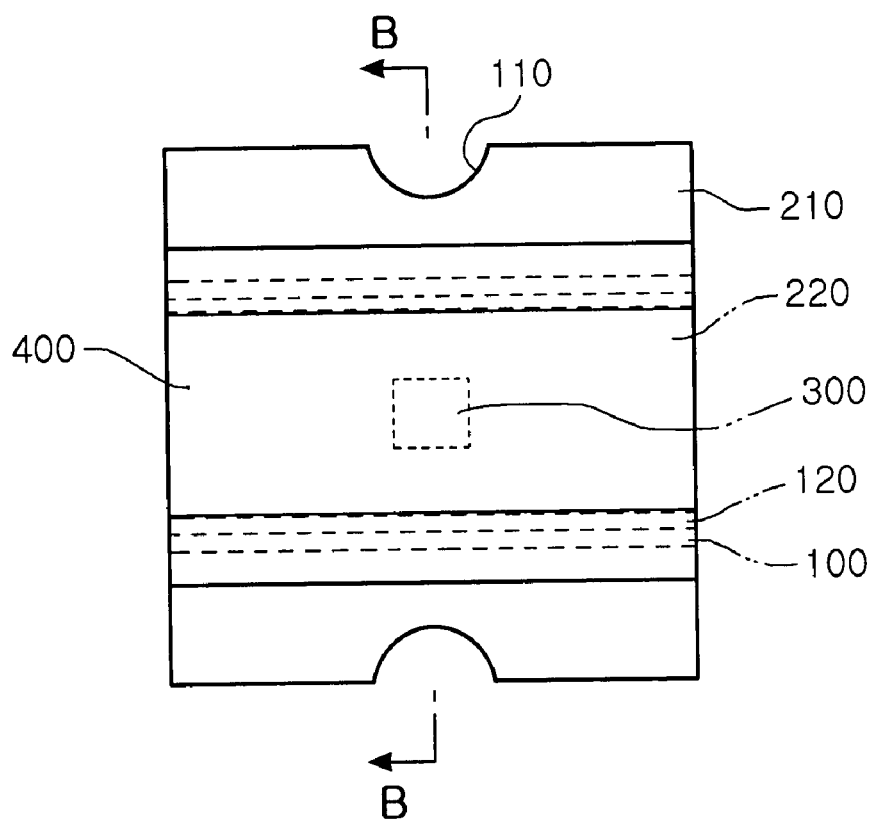
FIG. 8 is a plan view illustrating a light emitting diode package according to the invention.
Figure 9:
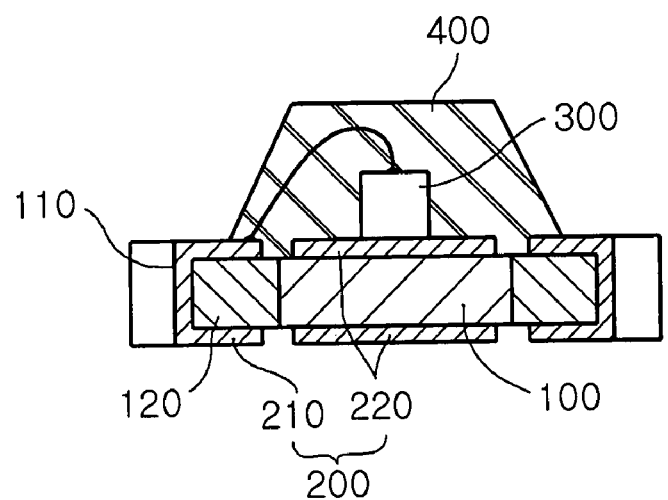
FIG. 9 is a side cross-sectional view illustrating a light emitting diode package according to the invention.

FIG. 8 is a plan view illustrating a light emitting diode package according to the invention. FIG. 9 is a side cross-sectional view illustrating a light emitting diode package cut along the line B-B of FIG. 8 according to the invention.

As shown in FIGS. 8 and 9, in the light emitting diode package of the invention, a light emitting diode 300 is connected to a board body 100 made of a thermally conductive metal through second conductive patterns 220 so that heat generated from the light emitting diode 300 is radiated outside through the board body more effectively. Here, preferably, the board body 100 is made of a high thermal conductive material to further boost heat radiation effects. More preferably, the board body 100 is made of aluminum which is high in thermal conductivity and low-priced. The board body 100 made of aluminum boosts radiation efficiency of heat generated from the light emitting diode 300 as just described and allows easier formation of insulating oxidation layers having a composition expressed by $Al_2O_3$ by anodizing.

Preferably, one of the second conductive patterns 20 is formed on an underside surface of the board body 100 so that heat can be conducted to another member or structure, on which the light emitting diode package is mounted, effectively through the underside surface of the board body 100. That is, the underside surface of the board body 100 is made contact with the mounting member or structure of the light emitting diode package.

The light emitting diode package according to the invention radiates heat from the light emitting diode faster and more effectively. Therefore, the light emitting diode package can adopt a low-power light emitting diode 300 with relatively lower heat radiation amount and a high-power light emitting diode 300 with relatively higher heat radiation amount.

Figure 10:
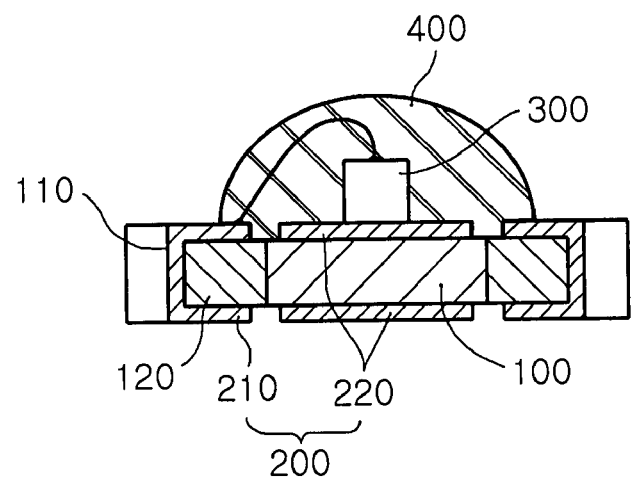
FIG. 10 is a side cross-sectional view illustrating a light emitting diode package according to a second embodiment of the invention.

FIG. 10 is a side cross-sectional view illustrating a light emitting diode package according to a second embodiment of the invention.

A transparent resin 400 applicable to the light emitting diode package, as shown in FIG. 9, may have a flat top surface, but alternatively the top surface thereof may feature various shapes such as a hemisphere as shown in FIG. 10 in order to adjust a light emitting angle of the light emitting diodes 300.

Shapes and materials of the transparent resin 400 can be varied, and thus will be explained in no more detail.

Figure 11:
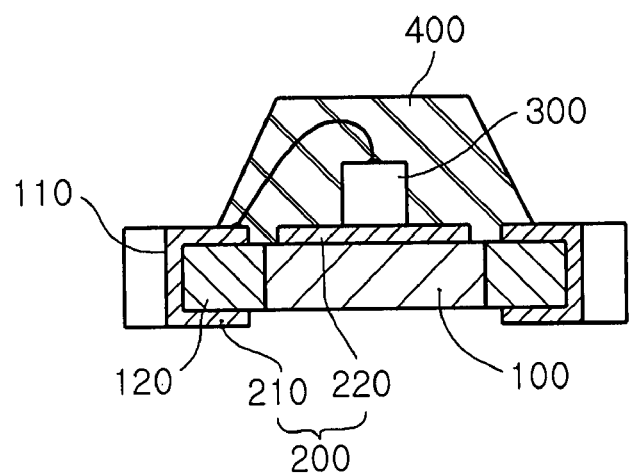
FIG. 11 is a side cross-sectional view illustrating a light emitting diode package according to a third embodiment of the invention.

FIG. 11 is a side cross-sectional view illustrating a light emitting diode package according to a third embodiment of the invention.

As shown in FIG. 11, in the light emitting diode package of the invention, a second conductive pattern 220 may be formed on only a top surface of the board body 100, but not on an underside surface thereof.

Here, when the light emitting diode package is mounted on another member or structure, the underside surface of the board body 100 is spaced apart from the mounting member, thereby radiating heat from the light emitting diode 300 by air circulation.

Moreover, the light emitting diode package shown in FIGS. 9 and 10 can be disposed only on a member having a flat top surface. However, the light emitting diode package shown in FIG. 11 can be disposed on a member with an uneven top surface.

Figure 12:
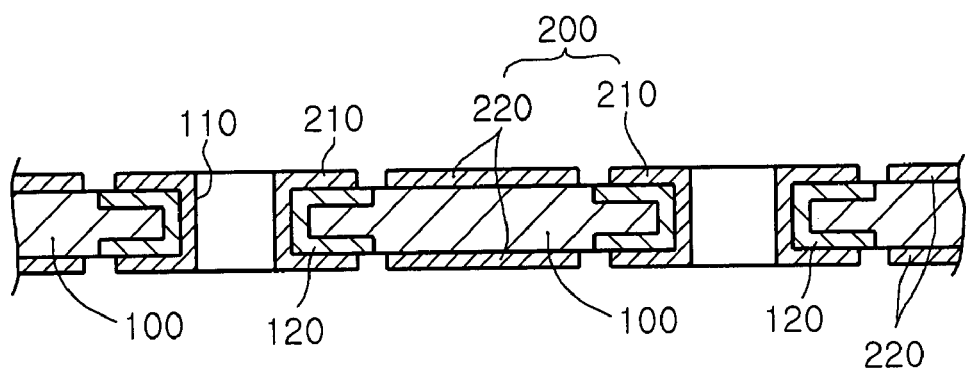
FIG. 12 is a side cross-sectional view illustrating a circuit board for a light emitting diode package according to an embodiment of the invention.
Figure 13:
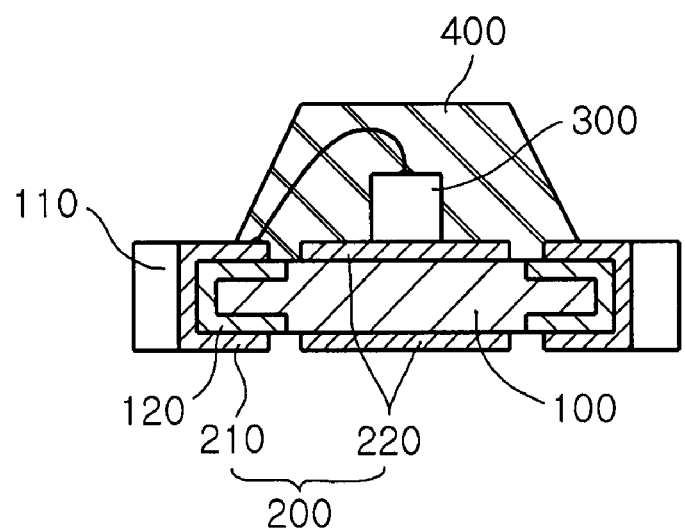
FIG. 13 is a side cross-sectional view illustrating a light emitting diode package according to a fourth embodiment of the invention.

FIG. 12 is a side cross-sectional view illustrating a circuit board for a light emitting diode package according to the invention. FIG. 13 is a side cross-sectional view illustrating a light emitting diode package according to a fourth embodiment of the invention.

As shown in FIG. 12, the circuit board for the light emitting diode package of the invention has insulating oxidation layers 120 thinly formed in specific surface areas of the board body 100, that is, upper and lower surface areas of the board body 100 adjacent to upper and lower ends of the through holes 110, and inner wall surfaces thereof. Here, the insulating oxidation layers 120 formed adjacent to the upper and lower ends of the through holes 110 should be extended to at least a predetermined length toward a center of the board body 100 as shown in FIG. 11, thus providing a sufficient area for connecting wires of the light emitting diode 300.

As shown in FIGS. 10 and 11, the insulating oxidation layers 120 with a small thickness shortens the anodizing process therefor, and enlarges heat conductive area, which is not oxidized, thereby further enhancing heat radiation effects.

Figure 14:
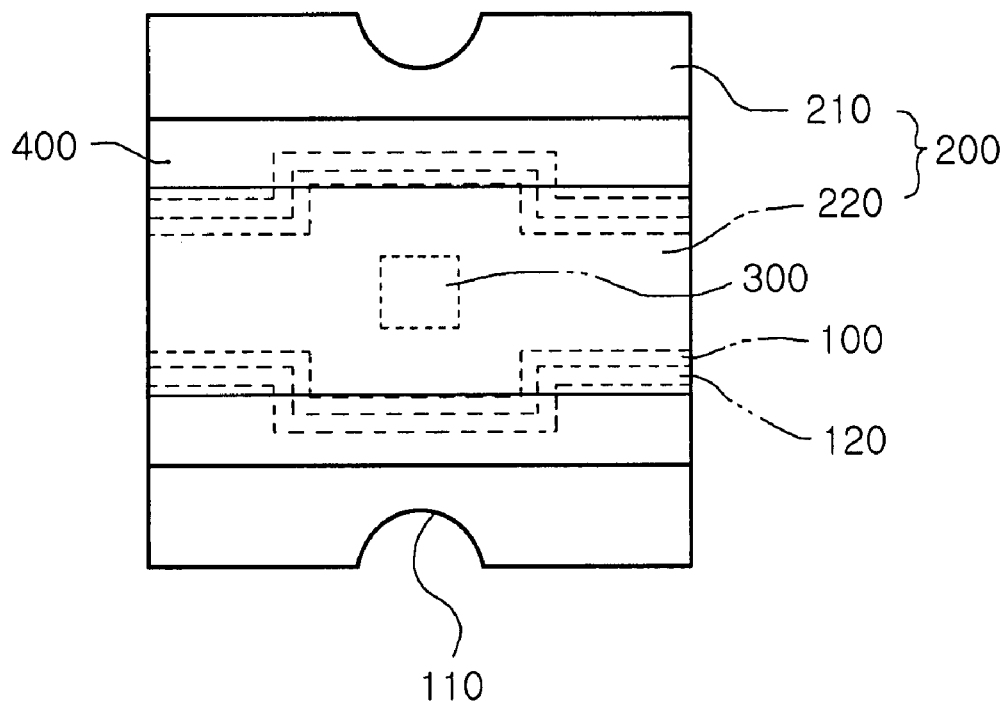
FIG. 14 is a plan view illustrating a light emitting diode package according to a fifth embodiment of the invention.

FIG. 14 is a plan view illustrating a light emitting diode package according to a fifth embodiment of the invention.

As shown in FIG. 14, in the light emitting diode package of the invention, the insulating oxidation layers 120 are formed at opposing edges of a board body 100 in such a fashion that both end portions of the insulating oxidation layers 120 in a top surface of the board body 100 are extended toward a central line of the board body 100, which is substantially parallel with the opposing edges.

With the both end portions of insulating oxidation layers 120 extended as just described, first conductive layers 210 on the insulating oxidation layers 120 can also be extended toward the central line of the board body 100. This assures more effective use of the insulating oxidation layers 120. Alternatively, in order to utilize the insulating oxidation layers 120, the first conductive layers 210 may be formed as shown in the embodiments 1 to 4 or alternatively only may be formed such that the both end portions thereof are extended toward the central line of the board body 100.

The insulating oxidation layers 120, and the first and second conductive patterns 210 and 220 can be configured variously without being limited to the embodiments of the invention.

As set forth above, according to exemplary embodiments of the invention, in a light emitting diode package, heat generated from a light emitting diode can be radiated faster and more effectively. Moreover, the light emitting diode package is improved in durability due to insulating layers formed integral with a board body, and also beneficially adopts both a low power light emitting diode and a high power light emitting diode.

According to the invention, the light emitting diode can be manufactured through a simple process, thereby saving manufacture costs. In addition, a plurality of light emitting diode packages can be manufactured to boost productivity.

While the present invention has been shown and described in connection with the preferred embodiments, it will be apparent to those skilled in the art that modifications and variations can be made without departing from the spirit and scope of the invention as defined by the appended claims.

What is claimed is:

1. A circuit board for a light emitting diode package having a light emitting diode disposed thereon, comprising:
   a board body made of a thermally conductive metal;
   insulating oxidation layers formed at a pair of opposing edges of the board body;
   first conductive patterns formed on the insulating oxidation layers, respectively, thereby being electrically insulated from the board body, the first conductive patterns being integrally provided on the top surface, both side surfaces and the bottom surface of both side portions of the insulating oxidation layers; and
   second conductive patterns formed on the board body between the first conductive patterns and disposed at a predetermined distance from the first conductive patterns, respectively, thereby being electrically isolated from the first conductive patterns,
   wherein the light emitting diode is disposed on the second conductive patterns and connected to the board body through the second conductive patterns.

2. The circuit board according to claim 1, wherein the board body is made of one selected from a group consisting of aluminum, titanium, tantal, magnesium, hafnium and alloys thereof.

3. The circuit board according to claim 1, wherein the insulating oxidation layers are formed by anodizing.

4. The circuit board according to claim 1, wherein the insulating oxidation layers have a uniform thickness.

5. The circuit board according to claim 1, wherein the insulating oxidation layers are formed on surfaces of the-edges of the board body including upper and lower surfaces and flank surfaces thereof.

6. The circuit board according to claim 1, wherein the insulating oxidation layers have both end portions thereof located in a top surface of the board body extending toward a central line of the board body, which is substantially parallel with the opposing edges.

7. A light emitting diode package comprising:
   a board body made of a thermally conductive metal;

insulating oxidation layers formed at a pair of opposing edges of the board body;

first conductive patterns formed on the insulating oxidation layers, respectively, thereby being electrically insulated from the board body, the first conductive patterns being provided on the top surface and the underside surface of the insulating oxidation layers and on both side surfaces of the insulating oxidation layers in order to connect the first conductive patterns provided on the top surface and the underside surface of the insulating oxidation layers;

second conductive patterns formed on the surface of the board body between the first conductive patterns and disposed at a predetermined distance from the first conductive patterns, respectively, thereby being electrically isolated from the first conductive patterns;

a light emitting diode disposed on the second conductive patterns and electrically connected to the first conductive patterns; and a transparent resin covering the light emitting diode, wherein the light emitting diode is disposed on the second conductive patterns and connected to the board body through the second conductive patterns.

8. The light emitting diode package according to claim 7, wherein the board body is made of one selected from a group consisting of aluminum, titanium, tantal, magnesium, halfnium and alloys thereof.

9. The light emitting diode package according to claim 7, wherein the insulating oxidation layers are formed by anodizing.

10. The light emitting diode package according to claim 7, wherein the insulating oxidation layers have a uniform thickness.

11. The light emitting diode package according to claim 7, wherein the insulating oxidation layers are formed on surfaces of the-edges of the board body including upper and lower surfaces and flank surfaces thereof.

12. The light emitting diode package according to claim 7, wherein the insulating oxidation layers are formed such that both end portions thereof located in a top surface of the board body are extended toward a central line of the board body, which is substantially parallel with the opposing edges.

* * * * *